United States Patent
Nishizawa et al.

(10) Patent No.: US 11,831,277 B2
(45) Date of Patent: Nov. 28, 2023

(54) RESONATOR DEVICE

(71) Applicant: Seiko Epson Corporation, Tokyo (JP)

(72) Inventors: Ryuta Nishizawa, Nagano (JP); Junichi Takeuchi, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/826,216

(22) Filed: May 27, 2022

(65) Prior Publication Data

US 2022/0385236 A1    Dec. 1, 2022

(30) Foreign Application Priority Data

May 31, 2021   (JP) ................ 2021-091207

(51) Int. Cl.
    *H03B 5/32*    (2006.01)
    *H03H 9/08*    (2006.01)
    *H03H 9/05*    (2006.01)

(52) U.S. Cl.
    CPC ............. *H03B 5/32* (2013.01); *H03H 9/0538* (2013.01); *H03H 9/08* (2013.01)

(58) Field of Classification Search
    CPC .......... H03B 5/32; H03H 9/0538; H03H 9/08; H03H 9/02102; H03H 9/1021; H03H 9/19; H03H 9/0547
    See application file for complete search history.

(56) References Cited

U.S. PATENT DOCUMENTS

| | | | | |
|---|---|---|---|---|
| 2010/0313399 | A1* | 12/2010 | Aratake | H03H 3/02 29/25.35 |
| 2011/0234052 | A1* | 9/2011 | Amano | H03H 9/172 216/34 |
| 2013/0049542 | A1* | 2/2013 | Otsuki | H05K 1/0243 29/25.35 |
| 2015/0155849 | A1* | 6/2015 | Kikuchi | H03H 9/1014 228/124.1 |

FOREIGN PATENT DOCUMENTS

| | | |
|---|---|---|
| JP | 2004-320417 A | 11/2004 |
| JP | 2021-136669 A | 9/2021 |

* cited by examiner

*Primary Examiner* — Jeffrey M Shin
(74) *Attorney, Agent, or Firm* — Harness, Dickey & Pierce, P.L.C.

(57) ABSTRACT

A resonator device includes a resonator element, a base which has a first surface and a second surface that are in front-back relation, and in which the resonator element is arranged at the first surface, an integrated circuit provided to the base, a lid which has an inner surface opposed to the resonator element, and an outer surface in a front-back relationship with the inner surface, and which is bonded to the base so as to house the resonator element, and a radiation layer which is arranged at the inner surface of the lid, and is higher in emissivity than the lid.

11 Claims, 9 Drawing Sheets

RESONATOR DEVICE

The present application is based on, and claims priority from JP Application Serial Number 2021-091207, filed May 31, 2021, the disclosure of which is hereby incorporated by reference herein in its entirety.

BACKGROUND

1. Technical Field

The present disclosure relates to a resonator device.

2. Related Art

In JP-A-2004-320417 (Document 1), there is described a temperature-compensated oscillator which has a crystal resonator, a temperature sensor, and an IC including a compensation voltage generation circuit and an oscillation circuit in a single chip, and in which the crystal resonator and the IC are housed in a ceramic package. Further, the ceramic package has a ceramic base shaped like a box having a recessed part opening on an upper surface, and a metal lid bonded to the upper surface of the ceramic base so as to close the opening of the recessed part, wherein the IC is fixed to a bottom surface of the recessed part, and the crystal resonator is fixed to a stepped surface of the recessed part.

However, in the temperature-compensated oscillator in Document 1, the thermal insulation property of the ceramic base is high, and the heat generated by the IC is apt to be confined in the ceramic package. Therefore, there is a problem that the temperature of the crystal resonator in the ceramic package does not stabilize, and thus, the oscillation characteristic deteriorates.

SUMMARY

A resonator device according to the present disclosure includes a resonator element, a base which has a first surface and a second surface that are in front-back relation, and in which the resonator element is arranged at the first surface, an integrated circuit provided to the base, a lid which has an inner surface opposed to the resonator element, and an outer surface in a front-back relationship with the inner surface, and which is bonded to the base so as to house the resonator element, and a radiation layer which is arranged at the inner surface of the lid, and is higher in emissivity than the lid.

DESCRIPTION OF EXEMPLARY EMBODIMENTS

Some preferred embodiments of a resonator device will hereinafter be described based on the accompanying drawings. It should be noted that the upper side of each of FIG. 1 through FIG. 5, and FIG. 12 is also referred to as an "upper side," and the lower side thereof is also referred to as a "lower side" for the sake of convenience of explanation. In that case, in FIG. 6 through FIG. 11, the front side of the sheet is the "upper side," and the back side is the "lower side."

First Embodiment

Figure 1:
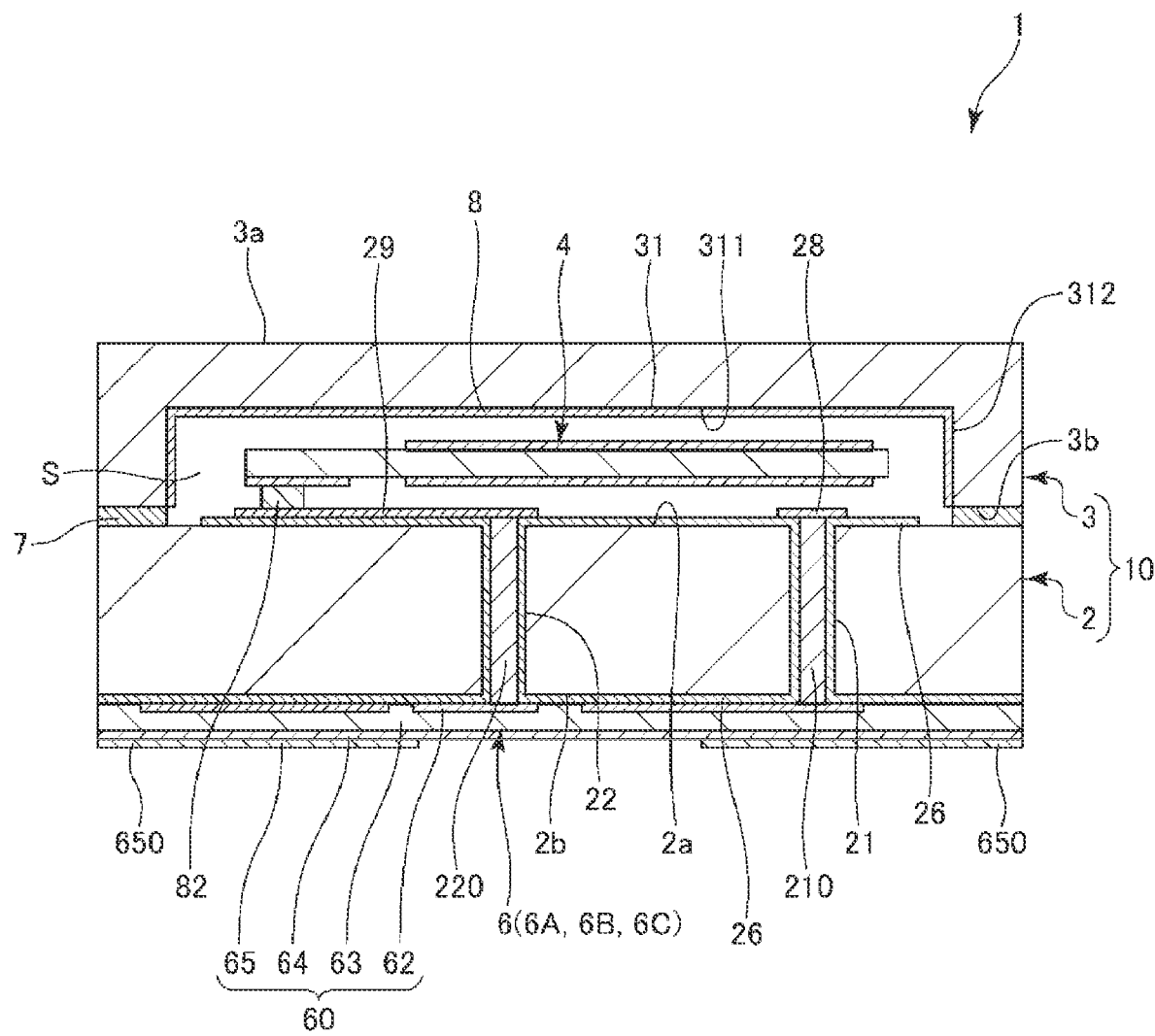
FIG. 1 is a cross-sectional view showing a resonator device according to a first embodiment, and is a cross-sectional view along the line A-A in FIG. 2.
Figure 2:
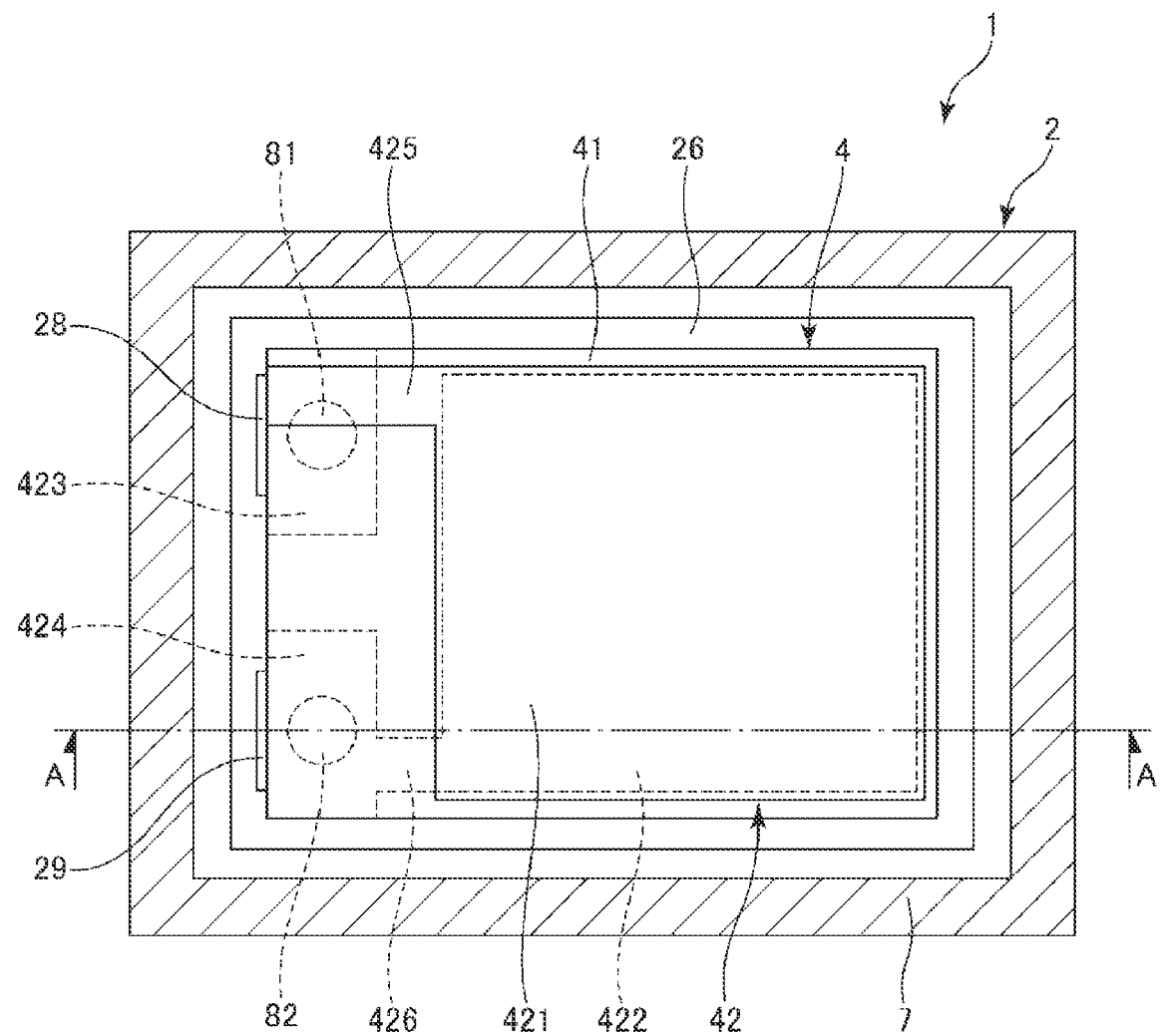
FIG. 2 is a plan view showing a resonator element.

FIG. 1 is a cross-sectional view showing a resonator device according to a first embodiment, and is a cross-sectional view along the line A-A in FIG. 2. FIG. 2 is a plan view showing a resonator element.

The resonator device 1 shown in FIG. 1 has a package 10 shaped like a substantially rectangular solid (a regular hexahedron) having an airtight housing section S inside, and the resonator element 4 housed in the housing section S. Further, the package 10 has a base 2 to which the resonator element 4 is bonded via a pair of metal bumps 81, 82, and a lid 3 bonded to an upper surface 2a of the base 2 so as to cover the resonator element 4. Further, at the lower surface 2b side of the base 2, there is formed an integrated circuit 6 electrically coupled to the resonator element 4.

The base 2 is a silicon substrate. In particular, in the present embodiment, a P-type silicon substrate is used. Therefore, when using the resonator device 1, the base 2 is coupled to the ground as a constant potential. It should be noted that the base 2 is not particularly limited, and can be an N-type silicon substrate. Further, it is possible to use a semiconductor substrate other than silicon such as a semiconductor substrate made of, for example, Ge, GaP, GaAs, or InP.

The base 2 has a plate-like shape, and has the upper surface 2a as a first surface and the lower surface 2b as a second surface, wherein the first surface and the second surface that are in front-back relation. Further, an insulating film 26 is formed on each of the upper surface 2a and the lower surface 2b. The insulating film 26 is, for example, a silicon oxide film formed by thermally oxidizing the surfaces of the base 2. It should be noted that the insulating film 26 is not particularly limited, and can be, for example, a silicon nitride film. Further, a formation method of the insulating films 26 is not limited to the thermal oxidation, and can be, for example, CVD (Chemical Vapor Deposition).

Further, at the lower surface 2b side of the base 2, there is formed the integrated circuit 6 electrically coupled to the resonator element 4. By providing the integrated circuit 6 to the base 2 as described above, it is possible to effectively use the base 2. In particular, by forming the integrated circuit 6 at the lower surface 2b side, a bonding area with the lid 3 is eliminated compared to when forming the integrated circuit 6 at the upper surface 2a side as in a second embodiment described later, and accordingly, a larger formation space for the integrated circuit 6 can be ensured.

Further, in the integrated circuit 6, there are included, for example, a temperature sensor 6A for detecting the temperature of the resonator element 4, a temperature compensation circuit 6B for compensating a frequency-temperature characteristic inherent in the resonator element 4 based on the detection result of the temperature sensor 6A, and an oscillation circuit 6C for oscillating the resonator element 4 to generate an oscillation signal such as a clock signal. In other words, the resonator device 1 according to the present embodiment is a temperature-compensated resonator device. Thus, the resonator device 1 having high frequency stability is achieved. Further, in the integrated circuit 6, there are included a power supply circuit, an output buffer, and so on besides the above. It should be noted that the configuration of the integrated circuit 6 is not particularly limited.

On the lower surface 2b, there is formed a stacked body 60 having a wiring layer 62, an insulating layer 63, a passivation film 64, and a terminal layer 65 stacked on one another. Further, a plurality of active elements which is formed on the lower surface 2b and is not shown is electrically coupled via interconnections included in the wiring layer 62, and thus, the integrated circuit 6 is formed. Further, the terminal layer 65 has a plurality of mounting terminals 650 electrically coupled to the integrated circuit 6. In the resonator device 1, coupling between the integrated circuit 6 and an external device is achieved via the mounting terminals 650.

It should be noted that although the single wiring layer 62 is included in the stacked body 60 in the illustrated configuration, this is not a limitation, and it is possible to stack two or more wiring layers 62 on one another via the insulating layers 63. In other words, it is possible to alternately stack the wiring layers 62 and the insulating layers 63 a plurality of times. Thus, it is possible to increase a degree of freedom in, for example, a layout of the interconnections in the integrated circuit 6, and an arrangement of the plurality of mounting terminals 650.

Further, the base 2 is provided with a pair of through holes 21, 22 penetrating the base 2 in the thickness direction. The through holes 21, 22 are filled with an electrically-conductive material such as a metal material, and thus, through electrodes 210, 220 are formed. Further, on the upper surface 2a of the base 2, there are arranged a pair of interconnections 28, 29 electrically coupled to the resonator element 4. The interconnection 28 is electrically coupled to the integrated circuit 6 via the through electrode 210, and the interconnection 29 is electrically coupled to the integrated circuit 6 via the through electrode 220.

The lid 3 is a silicon substrate similarly to the base 2. Thus, the base 2 and the lid 3 become equal in linear expansion coefficient to each other to prevent the thermal stress caused by the thermal expansion from occurring, and thus, the resonator device 1 having excellent vibration characteristics is achieved. Further, since it is possible to form the resonator device 1 with the semiconductor process, the resonator device 1 can accurately be manufactured, and at the same time, it is possible to achieve reduction in size thereof. It should be noted that the lid 3 is not particularly limited, and it is possible to use a semiconductor substrate other than silicon such as a semiconductor substrate made of, for example, Ge, GaP, GaAs, or InP.

Further, the lid 3 is shaped like a box, and has an upper surface 3a, a lower surface 3b, and a housing recess 31 which has a bottom, opens on the lower surface 3b, and houses the resonator element 4 inside. The lower surface 3b of such a lid 3 is bonded to the upper surface 2a of the base 2 via a metal layer 7. By bonding the base 2 and the lid 3 to each other via the metal layer 7, it is possible to solidly and intimately bond the base 2 and the lid 3 to each other. Therefore, it is possible to increase the strength of the package 10, and at the same time, it is possible to enhance the airtightness of the housing section S.

Further, the lid 3 is electrically coupled to the base 2 via the metal layer 7. As described above, since the base 2 is coupled to the ground when using the resonator device 1, the lid 3 is also coupled to the ground in the same manner. Therefore, the whole of the package 10 functions as a shield, and thus, it is possible to reduce an influence of an electromagnetic noise from the outside. Therefore, the resonator device 1 high in reliability is achieved.

Further, on each of inner surfaces of the lid 3, namely a bottom surface 311, and side surface 312 of the housing recess 31, there is arranged a radiation layer 8 higher in emissivity than the lid 3. Thus, it is possible for the radiation layer 8 to absorb the heat (mainly radiation heat from the integrated circuit 6) in the housing section S, and then efficiently radiate the heat thus absorbed from the lid 3 to the outside. Therefore, the temperature of the resonator element 4 further stabilizes, and there is achieved the resonator device 1 which is smaller in frequency deviation, and has the oscillation characteristic higher in accuracy. In particular, by arranging the radiation layer 8 not only on the bottom surface 311 but also on the side surface 312, it is possible to exert a higher heat radiation effect.

The definition of the "emissivity" in the present specification is based on JIS Z8117, and the emissivity can be measured by, for example, a spectral emissivity measurement method using an FTIR (Fourier transform infrared spectrophotometer) compliant with JIS R1801.

It should be noted that since the emissivity at room temperature of silicon as a constituent material of the lid 3 is assumed as about 0.2, the emissivity at room temperature of the radiation layer 8 is only required to be higher than this value, and is preferably no lower than 0.5. Thus, it is possible to more efficiently release the heat in the housing section S from the lid 3 to the outside, and thus, the resonator device 1 having the oscillation characteristic higher in accuracy is achieved.

It is preferable for the constituent material of such a radiation layer 8 to include at least one of copper oxide (0.87), titanium oxide (0.51 through 0.61), silicon oxide (0.65 through 0.9), silicon nitride (0.75 through 0.9), a glass material (0.91 through 0.94), aluminum nitride (0.93), nickel oxide (0.31 through 0.46), and platinum black (0.93). It should be noted that the numerical values in the parentheses represent the emissivity of the respective materials. Among these materials, copper oxide, titanium oxide, silicon oxide, silicon nitride, and aluminum nitride, in particular, are each a material easy to use in the semiconductor process, and therefore, by using these materials, it becomes easy to manufacture the resonator device 1. Further, since nickel oxide and platinum black are each a material easy to use in a sputtering process, by using these materials, it becomes easy to manufacture the resonator device 1.

Further, as the constituent material of the radiation layer 8, the metal materials such as copper oxide, titanium oxide, aluminum nitride, nickel oxide, and platinum black are more preferably used than the silicon materials such as silicon oxide and silicon nitride. The metal materials are higher in thermal conductivity than the silicon materials, and can exert a higher heat radiation effect.

It should be noted that although the radiation layer 8 is arranged on both of the bottom surface 311 and the side surface 312 of the housing recess 31 in the present embodiment, this is not a limitation, and it is possible to, for example, arrange the radiation layer 8 only on the bottom surface 311, or arrange the radiation layer 8 only on the side surface 312.

The housing section S in the package 10 is airtightly sealed, and is set in a reduced-pressure state, and preferably in a state more approximate to a vacuum state. Thus, the viscosity resistance decreases and the oscillation characteristic of the resonator element 4 is improved. It should be noted that the atmosphere in the housing section S is not particularly limited, but can be an atmosphere filled with an inert gas such as nitrogen or Ar, or can be in the atmospheric pressure state or a pressurized state instead of the reduced-pressure state.

As shown in FIG. 2, the resonator element 4 has a vibrating substrate 41, and electrodes 42 arranged on a surface of the vibrating substrate 41. The vibrating substrate 41 has a thickness-shear vibration mode, and is formed of an AT-cut quartz crystal substrate in the present embodiment. Since the AT-cut quartz crystal substrate has the third-order frequency-temperature characteristic, the resonator element 4 having an excellent temperature characteristic is achieved. Further, the electrodes 42 include an excitation electrode 421 arranged on an upper surface, and an excitation electrode 422 arranged on a lower surface so as to be opposed to the excitation electrode 421. Further, the electrodes 42 include a pair of terminals 423, 424 arranged on the lower surface of the vibrating substrate 41, an interconnection 425 for electrically coupling the terminal 423 and the excitation electrode 421 to each other, and an interconnection 426 for electrically coupling the terminal 424 and the excitation electrode 422 to each other.

It should be noted that the configuration of the resonator element 4 is not limited to the configuration described above. For example, the resonator element 4 can be provided with a mesa structure in which a vibration area sandwiched between the excitation electrodes 421, 422 protrudes from the periphery of the vibration area, or can also be provided with an inverted-mesa structure in which the vibration area is recessed from the periphery of the vibration area in an opposite manner. Further, it is also possible to perform a bevel treatment for grinding the periphery of the vibrating substrate 41, or a convex treatment for changing the upper surface and the lower surface to a convex curved surface.

Further, the resonator element 4 is not limited to one vibrating in the thickness-shear vibration mode, and can be one having a plurality of vibrating arms making a flexural vibration in an in-plane direction such as a tuning-fork resonator element. In other words, the vibrating substrate 41 is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate.

Further, the constituent material of the vibrating substrate 41 is not limited to the quartz crystal, but it is possible for the vibrating substrate 41 to be formed of a piezoelectric single-crystal body made of, for example, lithium niobate, lithium tantalate, lithium tetraborate, langasite crystal, potassium niobate, or gallium phosphate, or to be formed of a piezoelectric single-crystal body made of another material than these. Furthermore, the resonator element 4 is not limited to the piezoelectrically-actuated resonator element, but can be an electrostatically-actuated resonator element using electrostatic force.

Such a resonator element 4 is bonded to the upper surface 2a of the base 2 via the pair of metal bumps 81, 82, and at the same time, electrically coupled to the interconnections 28, 29. The metal bumps 81, 82 are each, for example, a stud bump or a plated bump. The metal bumps 81, 82 are bonded to the interconnections 28, 29 using, for example, ultrasonic bonding, and are bonded to the terminals 423, 434 using thermocompression bonding, respectively. It should be noted that the bonding methods are not particularly limited. For example, it is possible to achieve one coupling using the metal bump, and the other coupling using a metal wire. Further, it is possible to use an electrically-conductive adhesive as the bonding material instead of the metal bumps 81, 82.

The resonator device 1 is hereinabove described. As described above, such a resonator device 1 has the resonator element 4, the base 2, the integrated circuit 6, the lid 3, and the radiation layer 8, wherein the base 2 has the upper surface 2a as the first surface and the lower surface 2b as the second surface, the first surface and the second surface being in the front-back relation, the resonator element 4 is arranged at the upper surface 2a side of the base 2, the integrated circuit 6 is provided to the base 2, the lid 3 has the bottom surface 311 as the inner surface opposed to the resonator element 4 and the upper surface 3a as the outer surface, the bottom surface 311 and the upper surface 3a being in the front-back relation, the lid 3 is bonded to the base 2 so as to house the resonator element 4, the radiation layer 8 is arranged on the bottom surface 311 of the lid 3, and the radiation layer 8 is higher in emissivity than the lid 3. Thus, the radiation layer 8 absorbs the heat in the housing section S, and then the heat thus absorbed is efficiently released from the lid 3 to the outside. Therefore, the temperature of the resonator element 4 further stabilizes, and there is achieved the resonator device 1 which is smaller in frequency deviation, and has the oscillation characteristic higher in accuracy.

Further, as described above, the base 2 and the lid 3 are each a silicon substrate. Thus, it is possible for each of the base 2 and the lid 3 to exert the high heat radiation property. Therefore, the temperature of the resonator element further stabilizes, and there is achieved the resonator device 1 which is smaller in frequency deviation, and has the oscillation characteristic higher in accuracy.

Further, as described above, it is preferable for the emissivity at room temperature of the radiation layer 8 to be no lower than 0.5. Thus, it is possible to more efficiently release the heat in the housing section S from the lid 3 to the outside, and thus, the resonator device 1 having the oscillation characteristic higher in accuracy is achieved.

Further, as described above, it is preferable for the constituent material of the radiation layer 8 to include at least one of copper oxide, titanium oxide, silicon oxide, silicon nitride, a glass material, aluminum nitride, nickel oxide, and platinum black. Thus, it becomes easy to form the radiation layer 8.

Further, as described above, the lid 3 has the housing recess 31 which uses the inner surface as the bottom surface 311 to house the resonator element 4, and the radiation layer 8 is also arranged on the side surface 312 of the housing recess 31. Thus, the area of the radiation layer 8 increases, and the effect of the radiation layer 8 becomes more conspicuous. Therefore, the temperature of the resonator element 4 further stabilizes, and there is achieved the resonator device 1 which is smaller in frequency deviation, and has the oscillation characteristic higher in accuracy.

Second Embodiment

Figure 3:
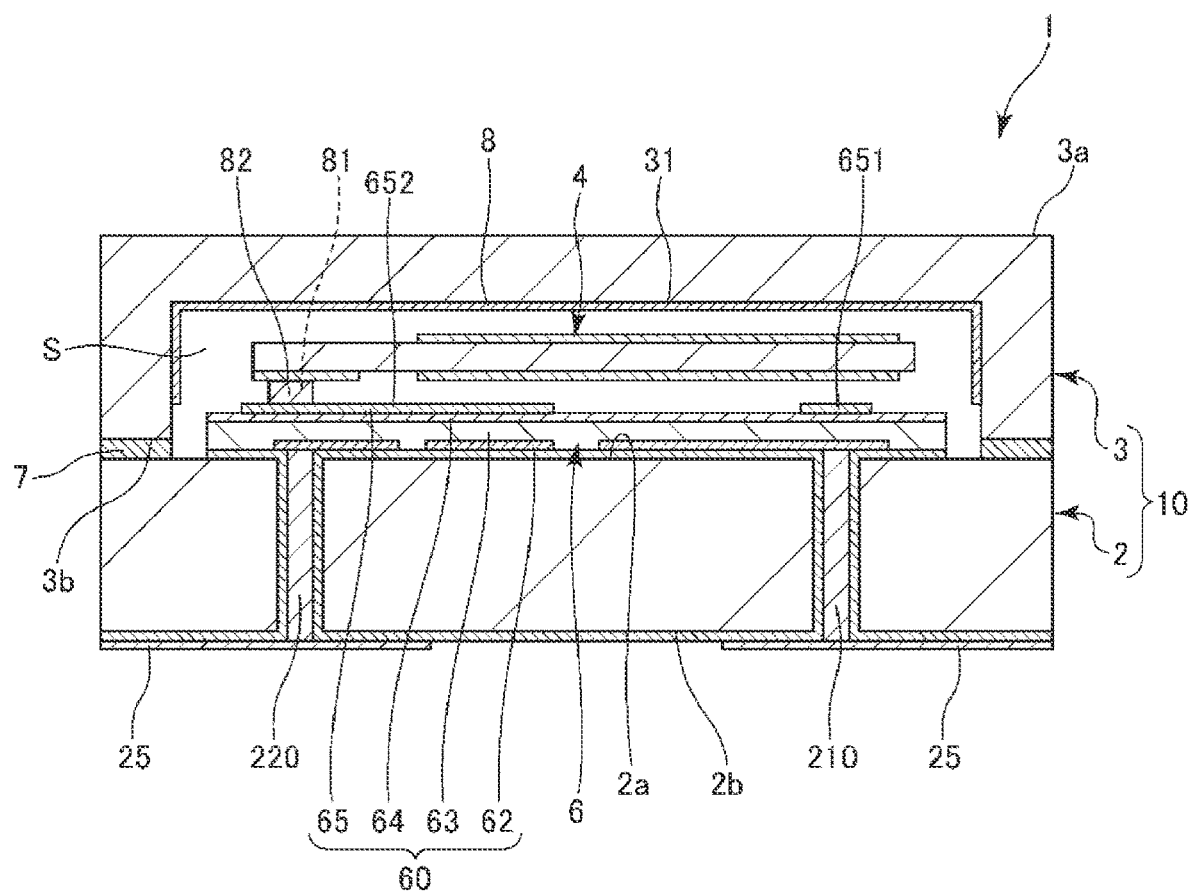
FIG. 3 is a cross-sectional view showing a resonator device according to a second embodiment.

FIG. 3 is a cross-sectional view showing a resonator device according to a second embodiment.

The present embodiment is substantially the same as the first embodiment described above except mainly the point that the arrangement of the integrated circuit 6 is different. In the following description, the present embodiment will be described with a focus on the difference from the embodiment described above, and the description of substantially the same issues will be omitted. Further, in each of the drawings in the present embodiment, the constituents substantially the same as those in the embodiment described above are denoted by the same reference symbols.

As shown in FIG. 3, in the resonator device 1 according to the present embodiment, the integrated circuit 6 is arranged at the upper surface 2a side of the base 2, and is housed in the housing section S. By adopting such a configuration, it is possible to protect the integrated circuit 6 from moisture and dust. Therefore, it is possible to increase the reliability of the resonator device 1. Further, since the heat of the integrated circuit 6 is more apt to be confined in the housing section S compared to the first embodiment described above, the effect of the radiation layer 8 becomes more conspicuous.

In the case of the present embodiment, the resonator element 4 is mounted above the integrated circuit 6, and in the terminal layer 65, there are included interconnections 651, 652 to electrically be coupled to the resonator element 4 via the metal bumps 81, 82, respectively. Further, at the lower surface 2b side of the base 2, there are arranged external terminals 25 electrically coupled to the integrated circuit 6 respectively via the through electrodes 210, 220.

As described hereinabove, in the resonator device 1 according to the present embodiment, the integrated circuit 6 is arranged at the upper surface 2a side as the first surface of the base 2. Thus, the heat of the integrated circuit 6 apt to be confined in the housing section S, and thus, the effect of the radiation layer 8 becomes more conspicuous.

According also to such a second embodiment described hereinabove, substantially the same advantages as in the first embodiment described above can be exerted.

Third Embodiment

Figure 4:
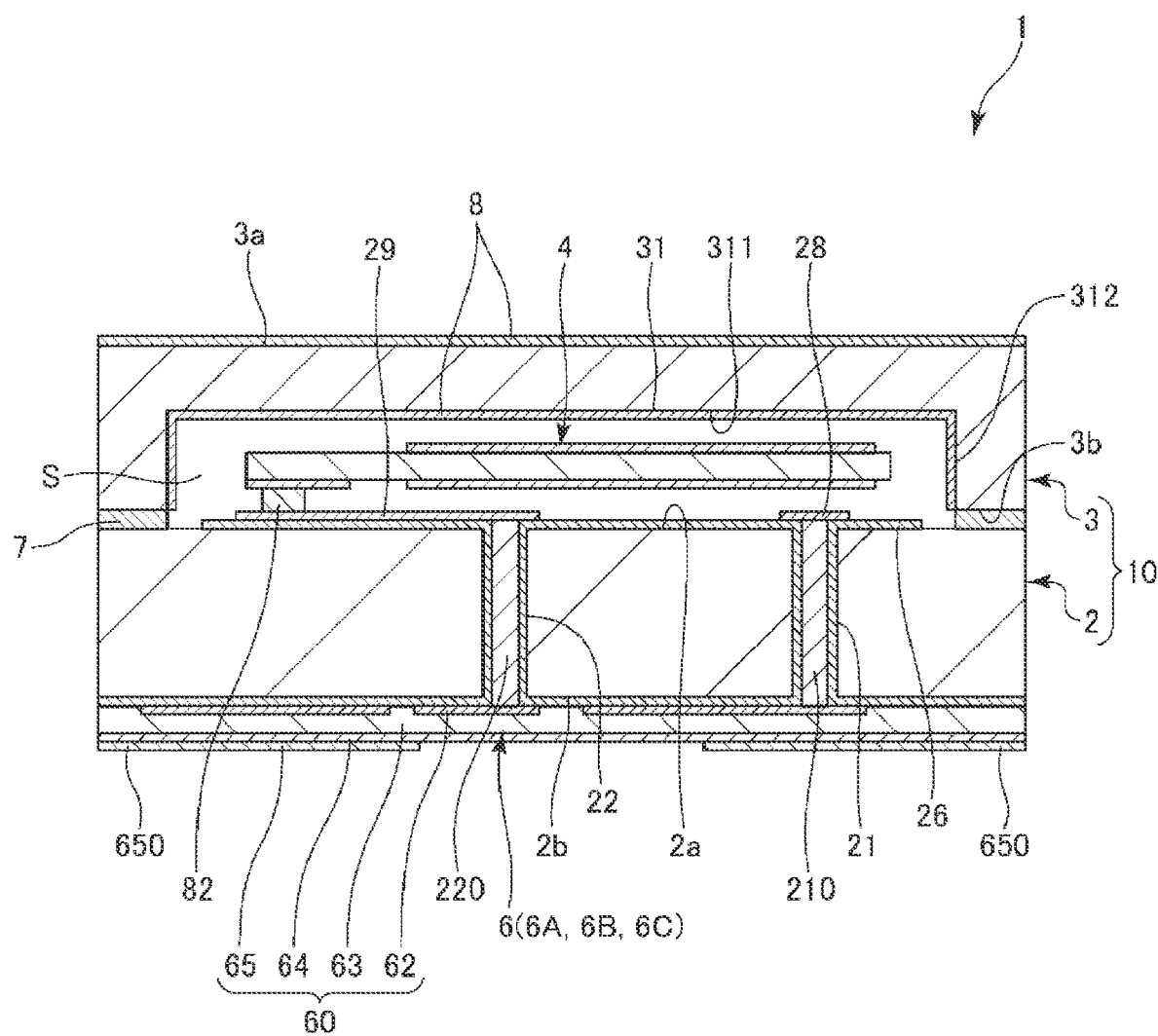
FIG. 4 is a cross-sectional view showing a resonator device according to a third embodiment.

FIG. 4 is a cross-sectional view showing a resonator device according to a third embodiment.

The present embodiment is substantially the same as the first embodiment described above except mainly the point that the radiation layer 8 is arranged also on an outer surface of the lid 3. In the following description, the present embodiment will be described with a focus on the difference from the embodiment described above, and the description of substantially the same issues will be omitted. Further, in each of the drawings in the present embodiment, the constituents substantially the same as those in the embodiment described above are denoted by the same reference symbols.

As shown in FIG. 4, in the resonator device 1 according to the present embodiment, the radiation layer 8 is arranged also on the upper surface 3a as the outer surface of the lid 3. Thus, it is possible to absorb the heat in the housing section S with the radiation layer 8 arranged on the bottom surface 311, and then efficiently release the heat thus absorbed from the radiation layer 8 arranged on the upper surface 3a. Therefore, the temperature of the resonator element 4 further stabilizes, and there is achieved the resonator device 1 which is small in frequency deviation, and has the oscillation characteristic high in accuracy. It should be noted that although in the present embodiment, the radiation layer 8 is arranged in the entire area of the upper surface 3a, this is not a limitation, and it is possible for the radiation layer 8 to be arranged on only a part of the upper surface 3a.

According also to such a third embodiment as described hereinabove, there can be exerted substantially the same advantages as in the first embodiment described above.

Fourth Embodiment

Figure 5:
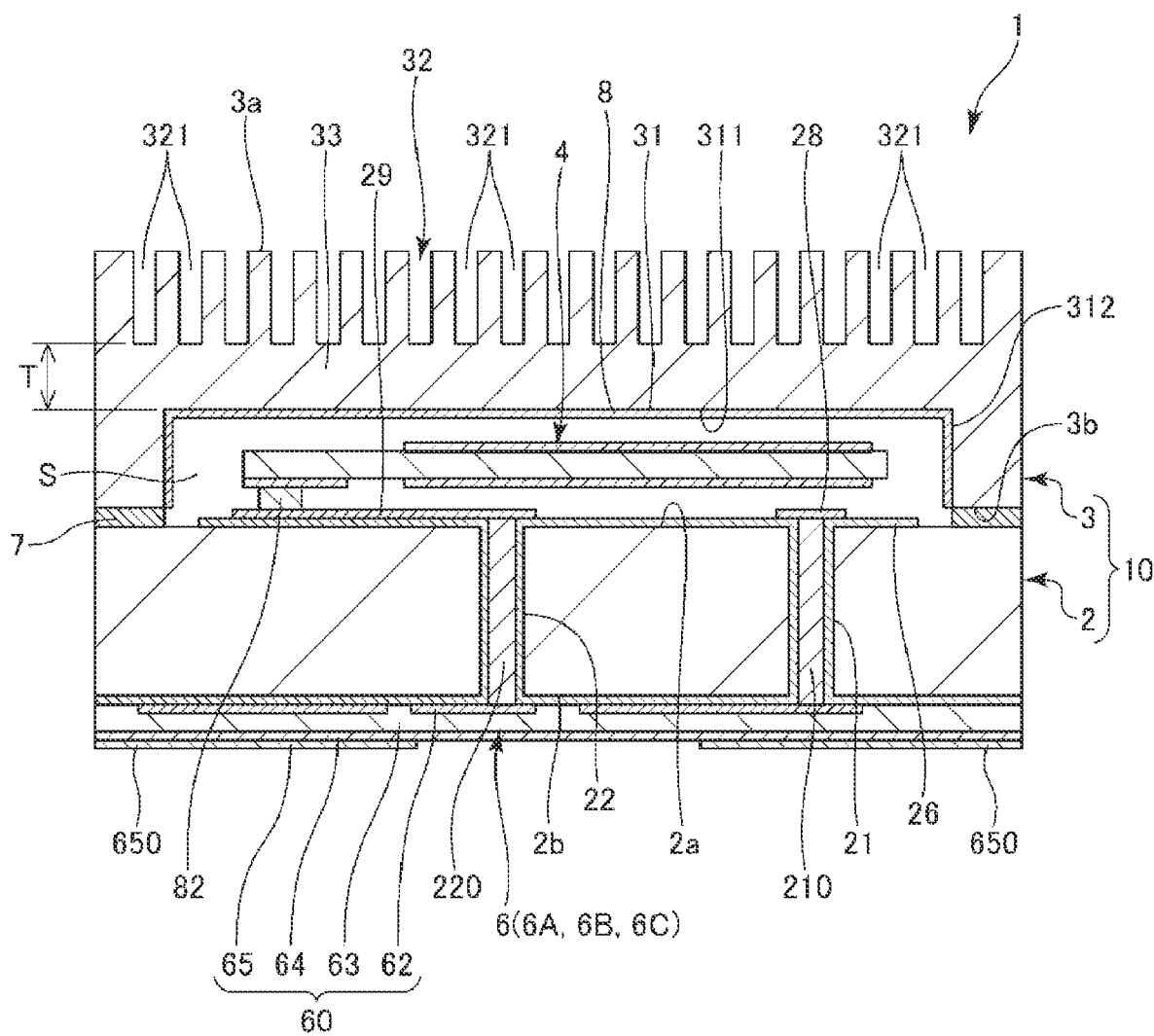
FIG. 5 is a cross-sectional view showing a resonator device according to a fourth embodiment.
Figure 6:
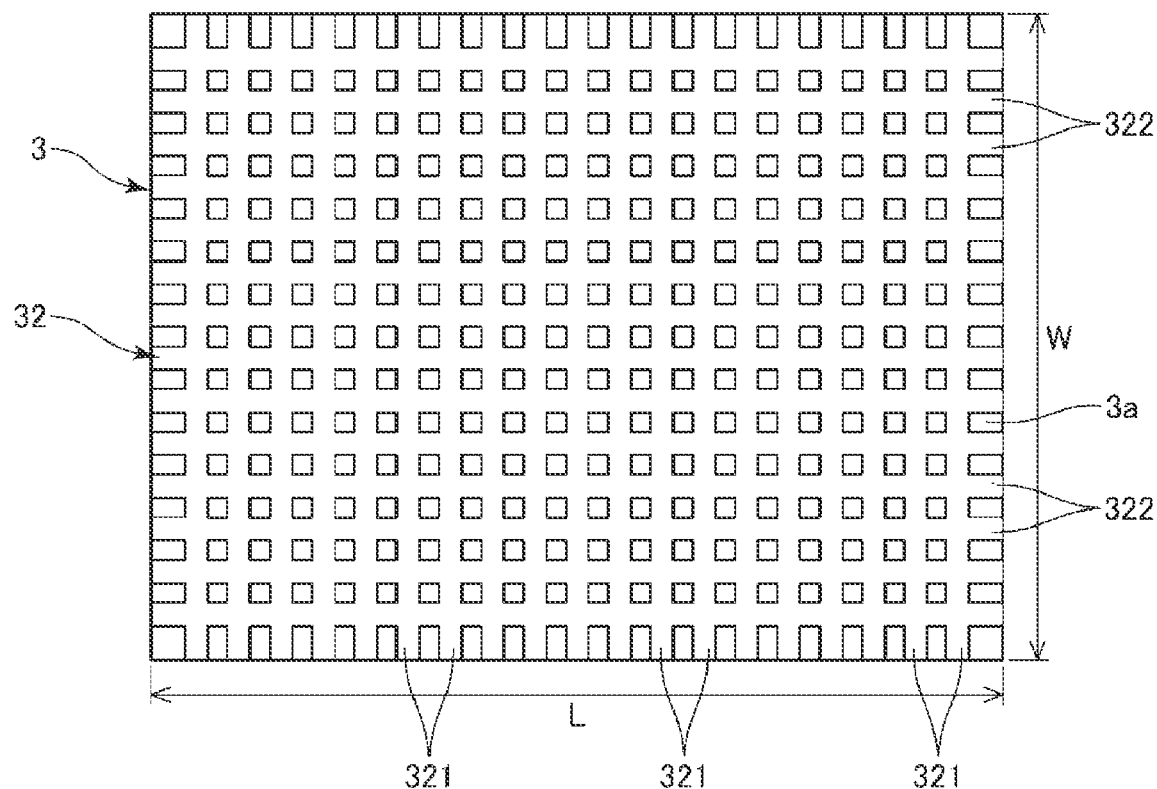
FIG. 6 is a plan view showing a recess formed at an upper surface of a lid.

FIG. 5 is a cross-sectional view showing a resonator device according to a fourth embodiment. FIG. 6 is a plan view showing a recess formed at the upper surface of the lid. FIG. 7 through FIG. 11 are each a plan view showing a modified example of the recess.

The present embodiment is substantially the same as the first embodiment described above except mainly the point that the recess 32 is formed on the upper surface 3a of the lid 3. In the following description, the present embodiment will be described with a focus on the difference from the embodiment described above, and the description of substantially the same issues will be omitted. Further, in each of the drawings in the present embodiment, the constituents substantially the same as those in the embodiment described above are denoted by the same reference symbols.

As shown in FIG. 5, in the resonator device 1 according to the present embodiment, the recess 32 opening on the upper surface 3a is formed. By forming the recess 32, the surface area of the lid 3 increases, and thus, the heat radiation property is enhanced. Therefore, the heat generated from the integrated circuit 6 is promptly released, and thus, the temperature fluctuation of the resonator element 4 housed inside can effectively be suppressed. Further, the temperature fluctuation of the resonator element 4 due to the environmental temperature fluctuation can also effectively be suppressed. Therefore, since the temperature of the resonator element 4 stabilizes, there is achieved the resonator device 1 which is small in frequency deviation, and has the oscillation characteristic high in accuracy. In particular, due to a synergistic effect with the radiation layer 8, the effect described above becomes conspicuous.

Hereinafter, the recess 32 will specifically be described. Hereinafter, for the sake of convenience of explanation, a direction along a width direction of the package 10 is defined as a first direction, and a direction along a longitudinal direction of the package 10 is defined as a second direction. In other words, in the present embodiment, the first direction and the second direction are perpendicular to each other. It should be noted that the first direction and the second direction are only required to cross each other, but are not required to be perpendicular to each other.

As shown in FIG. 6, the recess 32 has a plurality of first recesses 321 extending along the first direction. Further, the first recesses 321 are arranged at regular intervals in the second direction. Further, the recess 32 has a plurality of second recesses 322 extending along the second direction. Further, the second recesses 322 are arranged at regular intervals in the first direction. Therefore, the recess 32 forms a grid shape. According to such a configuration, it is possible to increase the surface area of the lid 3 with a simple configuration, and it is possible to exert an excellent heat radiation property.

Further, the first recesses 321 and the second recesses 322 are each shaped like a straight line. Thus, it is possible to form the first and second recesses 321, 322 using a dicing blade, and thus, it becomes easy to form the recess 32. It should be noted that the shapes of the first recesses 321 and the second recesses 322 are not particularly limited, and can, for example, meander in a wavelike fashion. Further, the method of forming the recess 32 is not particularly limited, and it is possible to form the recess 32 with, for example, etching or sandblasting.

Figure 7:
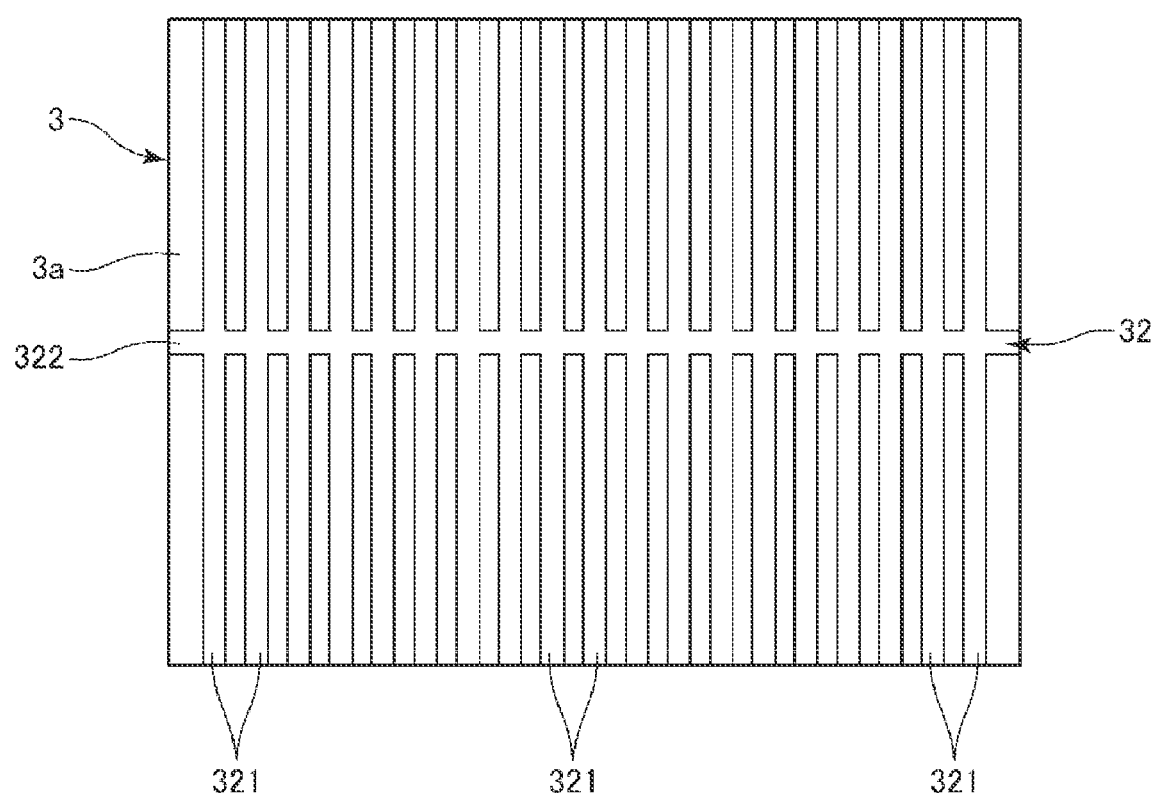
FIG. 7 is a plan view showing a modified example of the recess.
Figure 8:
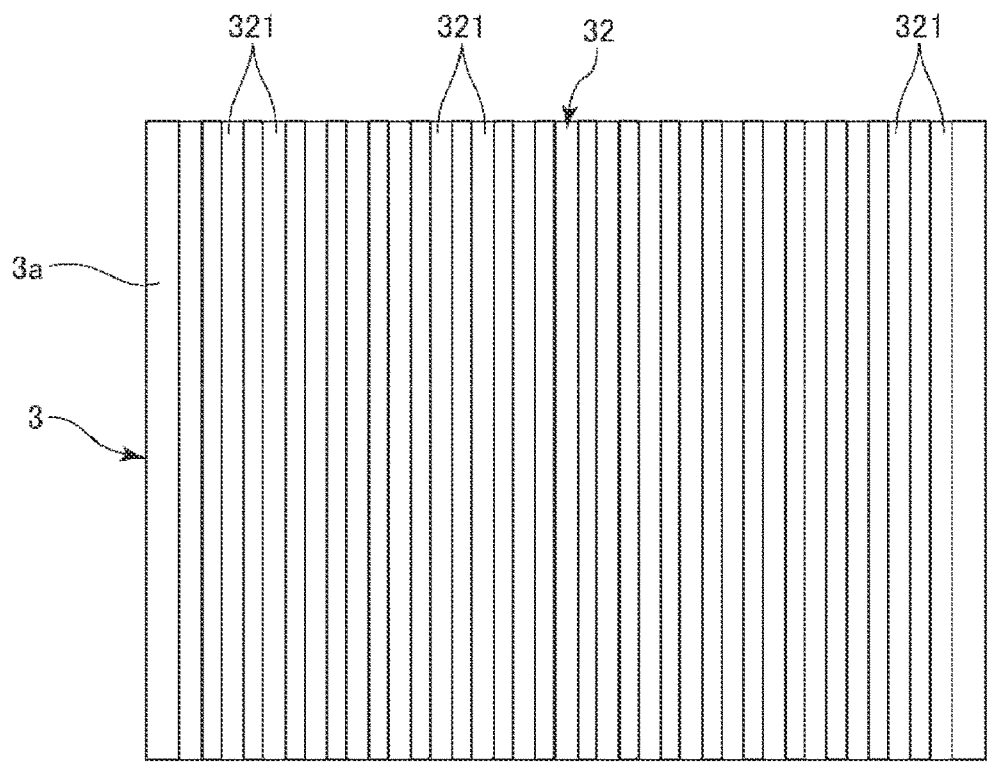
FIG. 8 is a plan view showing a modified example of the recess.
Figure 9:
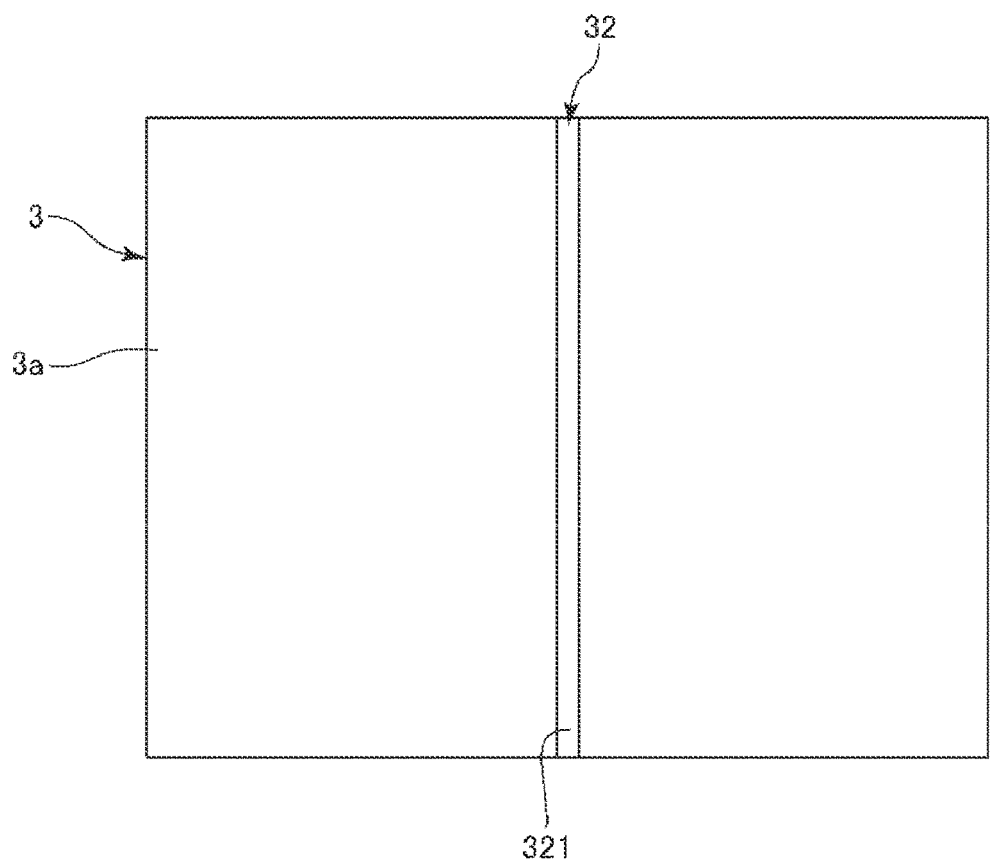
FIG. 9 is a plan view showing a modified example of the recess.

It should be noted that the configuration of the recess 32 is not particularly limited. For example, the number of the second recesses 322 can be one as shown in FIG. 7. Further, there can be adopted a configuration in which the second recesses 322 are omitted, and the recess 32 has only the plurality of first recesses 321 as shown in FIG. 8. Further, there can be adopted a configuration in which the recess 32 has just a single first recess 321 as shown in FIG. 9. According also to the recess 32 having such a configuration, there is achieved the recess 32 easy to form similarly to the present embodiment.

Figure 10:
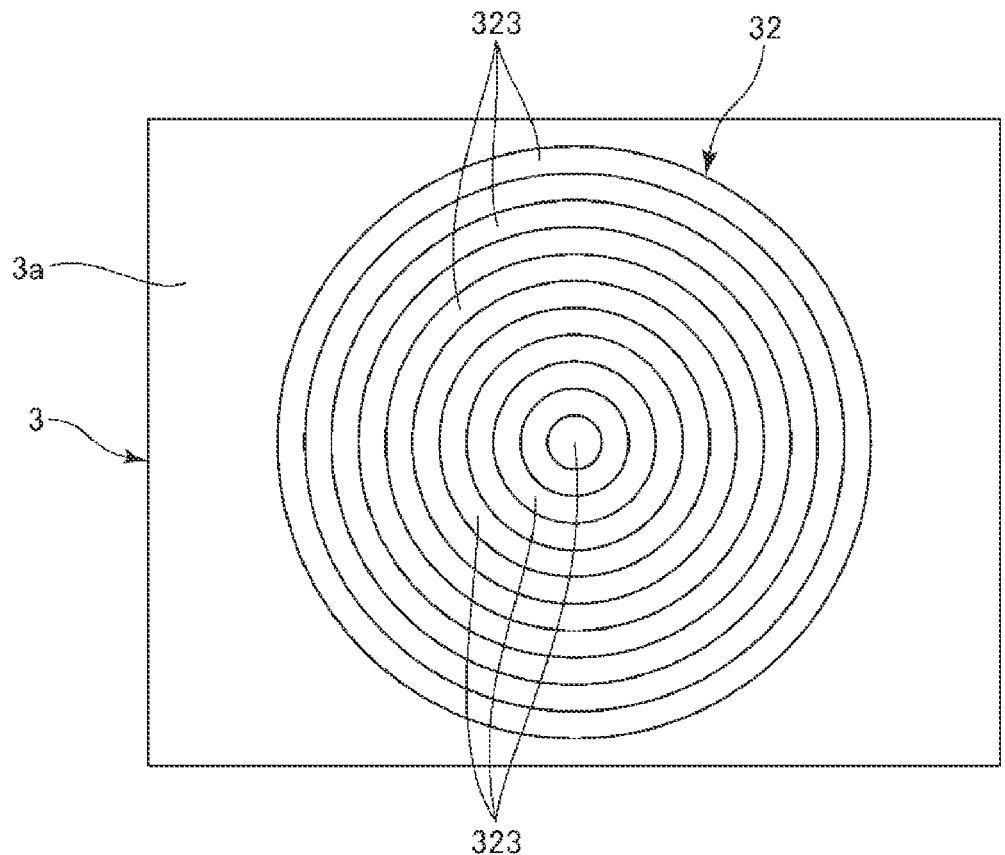
FIG. 10 is a plan view showing a modified example of the recess.
Figure 11:
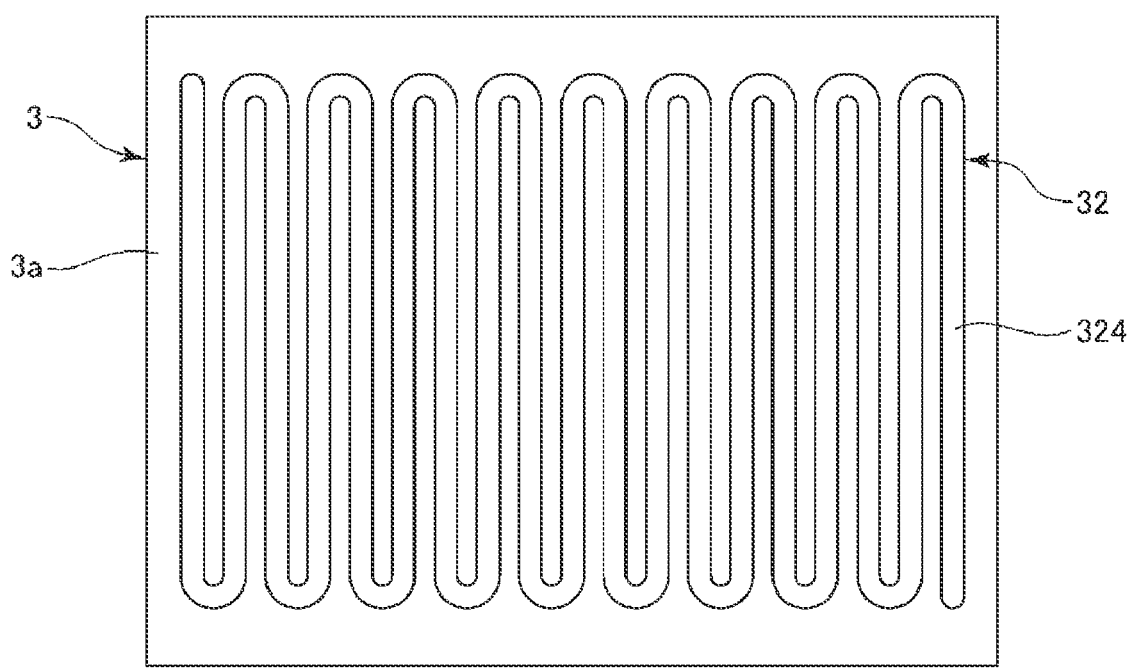
FIG. 11 is a plan view showing a modified example of the recess.

Further, for example, it is possible to adopt a configuration in which the recess 32 has a plurality of recesses 323 having ring-like shapes arranged concentrically as shown in FIG. 10, and it is possible to adopt a configuration in which the recess 32 has a recess 324 having a meandering shape as shown in FIG. 11.

Further, as shown in FIG. 5, a thickness T of a portion 33 between the inner surface of the lid 3, namely the bottom surface 311 of the housing recess 31, and a bottom surface of the recess 32 is not particularly limited, but is preferably no smaller than 10 μm when, for example, a planar size of the package 10 is no larger than 1.6 mm in length L, and no larger than 1.2 mm in width W. Thus, the portion 33 becomes sufficiently thick with respect to the size of the package 10, and thus, it is possible to prevent a deflection of the portion 33 caused by a difference in pressure between inside and outside the package 10. Therefore, there is achieved the resonator element 1 having sufficient mechanical strength.

As described hereinabove, in the resonator device 1 according to the present embodiment, the lid 3 has the recess 32 opening on the upper surface 3a. By forming the recess 32, the surface area of the lid 3 increases, and thus, the heat radiation property is enhanced. Therefore, the temperature fluctuation of the resonator element 4 can effectively be suppressed.

Further, as described above, the recess 32 has the first recess 321 shaped like a straight line extending along the first direction. Thus, it becomes easy to form the recess 32.

Further, as described above, the recess 32 has the second recess 322 shaped like a straight line extending along the second direction different from the first direction, and crossing the first recess 321. Thus, it becomes easy to form the recess 32.

According also to such a fourth embodiment as described hereinabove, there can be exerted substantially the same advantages as in the first embodiment described above. It should be noted that although in the present embodiment, the recess 32 is formed in the entire area of the upper surface 3a of the lid 3, this is not a limitation, and it is possible for the recess 32 to be formed on only a part of the upper surface 3a.

Fifth Embodiment

Figure 12:
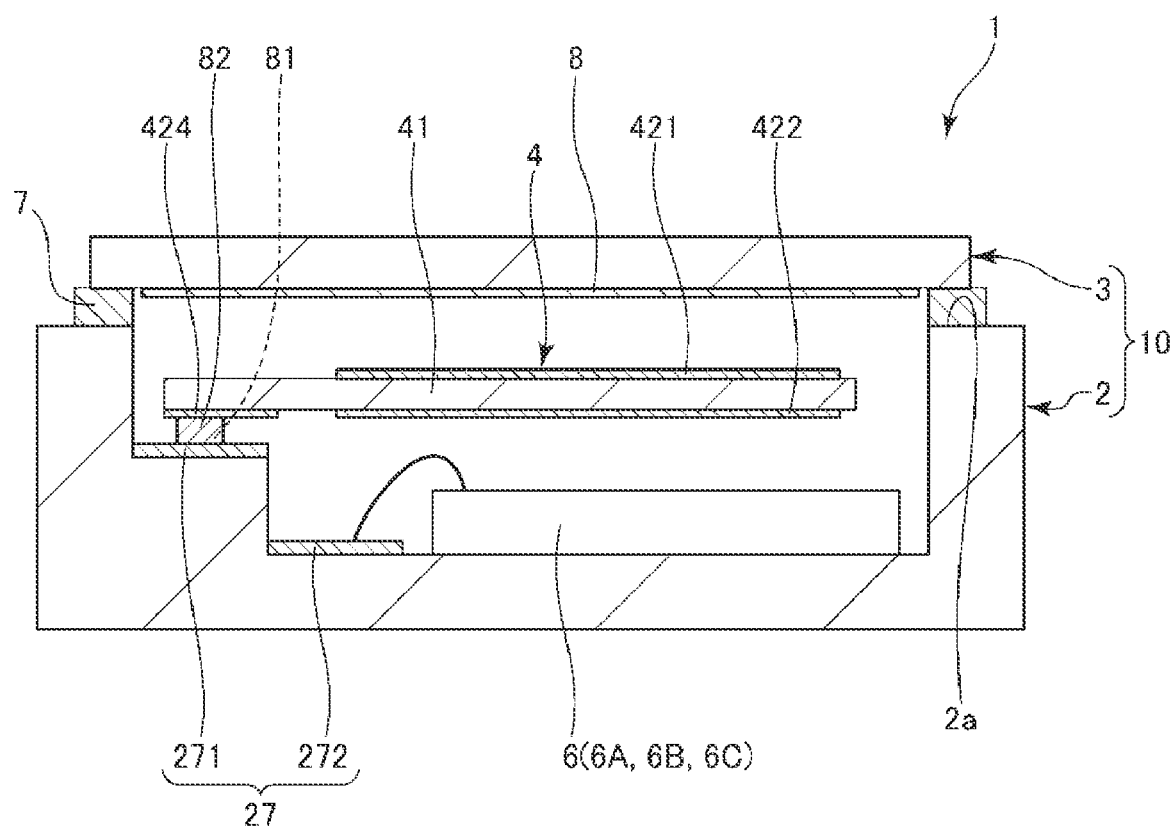
FIG. 12 is a cross-sectional view showing a resonator device according to a fifth embodiment.

FIG. 12 is a cross-sectional view showing a resonator device according to a fifth embodiment.

The present embodiment is substantially the same as the first embodiment described above except mainly the point that the configuration of the package 10 is different. In the following description, the present embodiment will be described with a focus on the difference from the embodiment described above, and the description of substantially the same issues will be omitted. Further, in each of the drawings in the present embodiment, the constituents substantially the same as those in the embodiment described above are denoted by the same reference symbols.

As shown in FIG. 12, in the resonator device 1 according to the present embodiment, the base 2 is formed of a ceramics substrate, and the lid 3 is formed of a metal substrate made of Kovar or the like. Thus, there is achieved the package 10 having high mechanical strength. Further, the integrated circuit 6 is formed as an IC chip as a separate body from the base 2.

Further, the base 2 has a recess 27 opening on the upper surface 2a, and the lid 3 is bonded to the upper surface 2a of the base 2 via the metal layer 7 so as to close the opening of the recess 27. Further, the recess 27 has a first recess 271 opening on the upper surface 2a, and a second recess 272 which opens on a bottom surface of the first recess 271, and is smaller than the first recess 271. Further, the integrated circuit 6 is fixed to a bottom surface of the second recess 272, and the resonator element 4 is fixed to the bottom surface of the first recess 271 via the metal bumps 81, 82. It should be noted that the resonator element 4 and the integrated circuit 6 are electrically coupled to each other via interconnections not shown formed inside the base 2.

Further, the radiation layer 8 is arranged on the inner surface, namely the lower surface, of the lid 3. Since the emissivity at room temperature of Kovar as the constituent material of the lid 3 is about 0.05, the emissivity of the radiation layer 8 is only required to be higher than this value, and is preferably no lower than 0.5. Thus, it is possible to more efficiently release the heat in the housing section S from the lid 3 to the outside, and thus, the resonator device 1 having the oscillation characteristic higher in accuracy is achieved. It should be noted that as the constituent material of the radiation layer 8, it is possible to use, for example, substantially the same material as in the first embodiment described above.

According also to such a fourth embodiment as described hereinabove, there can be exerted substantially the same advantages as in the first embodiment described above. It should be noted that it is possible to arrange the radiation layer 8 not only on the lower surface of the lid 3, but also on the outer surface, namely the upper surface, of the lid 3.

Although the resonator device according to the present disclosure is described hereinabove based on the illustrated embodiments, the present disclosure is not limited to these embodiments, and the configuration of each of the components can be replaced with one having substantially the same function and an arbitrary configuration. Further, the present disclosure can also be added with any other constituents. Further, it is also possible to arbitrarily combine any of the embodiments with each other.

What is claimed is:

1. A resonator device comprising:
   a resonator element;
   a base which has a first surface and a second surface that are in front-back relation, and in which the resonator element is arranged at the first surface;
   an integrated circuit provided to the base;
   a lid which has an inner surface opposed to the resonator element, and an outer surface in a front-back relationship with the inner surface, and which is bonded to the base so as to house the resonator element; and a radiation layer which is arranged at the inner surface of the lid, and is higher in emissivity than the lid, wherein the base and the lid are each a silicon substrate.

2. The resonator device according to claim 1, wherein the emissivity at room temperature of the radiation layer is no lower than 0.5.

3. The resonator device according to claim 1, wherein a material of the radiation layer includes at least one of copper oxide, titanium oxide, silicon oxide, silicon nitride, a glass material, aluminum nitride, nickel oxide, and platinum black.

4. The resonator device according to claim 1, wherein the lid has a housing recess which uses the inner surface as a bottom surface, and houses the resonator element, and the radiation layer is also arranged at a side surface of the housing recess.

5. The resonator device according to claim 1, wherein the radiation layer is also arranged at the outer surface of the lid.

6. The resonator device according to claim 1, wherein the integrated circuit is arranged at the first surface of the base.

7. The resonator device according to claim 1, wherein the lid has a recess at the outer surface.

8. The resonator device according to claim 7, wherein the recess has a first recess shaped like a straight line extending along a first direction.

9. The resonator device according to claim 8, wherein the recess has a second recess shaped like a straight line extending along a second direction different from the first direction, and crossing the first recess.

10. A resonator device comprising:

a resonator element;

a base which has a first surface and a second surface that are in front-back relation, and in which the resonator element is arranged at the first surface;

an integrated circuit provided to the base;

a lid which has an inner surface opposed to the resonator element, and an outer surface in a front-back relationship with the inner surface, and which is bonded to the base so as to house the resonator element; and a radiation layer which is arranged at each of the inner and outer surfaces of the lid and is higher in emissivity than the lid.

11. A resonator device comprising:

a resonator element;

a base which has a first surface and a second surface that are in front-back relation, and in which the resonator element is arranged at the first surface;

an integrated circuit provided to the base;

a lid which has an inner surface opposed to the resonator element, and an outer surface in a front-back relationship with the inner surface, and which is bonded to the base so as to house the resonator element; and a radiation layer which is arranged at the inner surface of the lid, and is higher in emissivity than the lid, wherein the lid has a recess at the outer surface, and the recess has a first recess shaped like a straight line extending along a first direction.

* * * * *